United States Patent
Lin et al.

(10) Patent No.: US 7,399,709 B1
(45) Date of Patent: Jul. 15, 2008

(54) COMPLEMENTARY REPLACEMENT OF MATERIAL

(75) Inventors: Burn-Jeng Lin, Hsinchu (TW); Hua-Tai Lin, Yu-Kuang (TW); Ru-Gun Liu, Yungkang (TW); Tsai-Sheng Gau, Hsin-Chu (TW); Bang-Chien Ho, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 1143 days.

(21) Appl. No.: 10/256,401

(22) Filed: Sep. 27, 2002

(51) Int. Cl.
*H01L 21/302* (2006.01)

(52) U.S. Cl. .............. 438/710; 438/689; 438/700; 438/706; 216/37; 216/41

(58) Field of Classification Search .............. 438/694, 438/725, 710; 216/41, 37
See application file for complete search history.

(56) References Cited

U.S. PATENT DOCUMENTS

| | | | | |
|---|---|---|---|---|
| 3,911,560 A | * | 10/1975 | Amelio et al. | 438/144 |
| 5,376,227 A | | 12/1994 | Lee | 156/643 |
| 5,380,609 A | * | 1/1995 | Fujita et al. | 430/5 |
| 5,413,884 A | * | 5/1995 | Koch et al. | 430/5 |
| 5,877,076 A | * | 3/1999 | Dai | 438/597 |
| 5,950,106 A | | 9/1999 | May et al. | 438/669 |
| 6,221,777 B1 | * | 4/2001 | Singh et al. | 438/692 |
| 6,306,558 B1 | | 10/2001 | Lin | 430/312 |
| 6,337,175 B1 | * | 1/2002 | Yamaguchi | 430/322 |
| 6,362,109 B1 | * | 3/2002 | Kim et al. | 438/706 |
| 6,436,810 B1 | * | 8/2002 | Kumar et al. | 438/633 |
| 6,660,456 B2 | * | 12/2003 | Wiltshire | 430/314 |
| 6,768,812 B1 | * | 7/2004 | Koljonen | 382/150 |
| 2001/0041306 A1 | * | 11/2001 | Cole et al. | 430/312 |
| 2002/0015900 A1 | * | 2/2002 | Petersen | 430/5 |

* cited by examiner

*Primary Examiner*—Nadine Norton
*Assistant Examiner*—Maki Angadi
(74) *Attorney, Agent, or Firm*—Thomas, Kayden, Horstemeyer & Risley

(57) ABSTRACT

An image reversal method is described that removes the etch resistance requirement from a resist. A high resolution resist pattern comprised of islands, lines, or trenches is formed with a large process window by exposing through one or more masks including phase edge masks and optionally with resolution enhancement techniques. A complementary material replacement (CMR) layer comprised of an organic polymer or material such as fluorosilicate glass which has a lower etch rate than the resist is coated over the resist pattern. CMR and resist layers are etched simultaneously to provide an image reversed pattern in the CMR layer which is etch transferred into a substrate. The method avoids edge roughness like bird's beak defects in the etched pattern and is useful for applications including forming contact holes in dielectric layers, forming polysilicon gates, and forming trenches in a damascene process. It is also valuable for direct write methods where an image reversal scheme is desired.

43 Claims, 9 Drawing Sheets

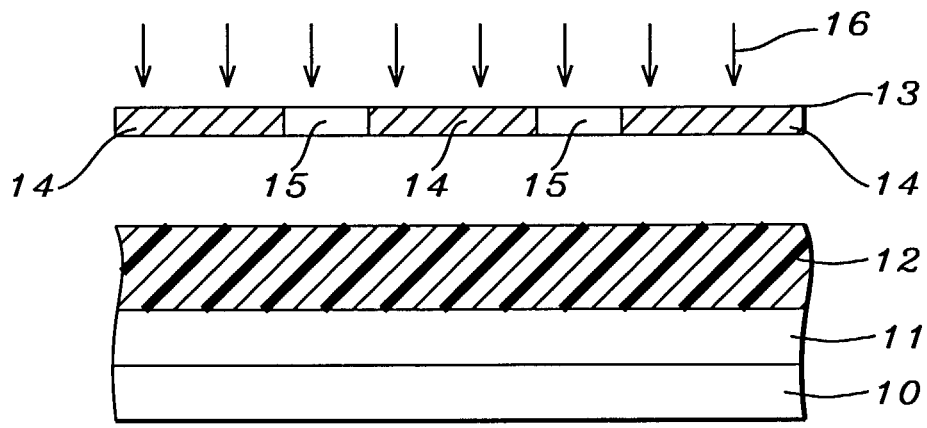
*FIG. 1a – Prior Art*
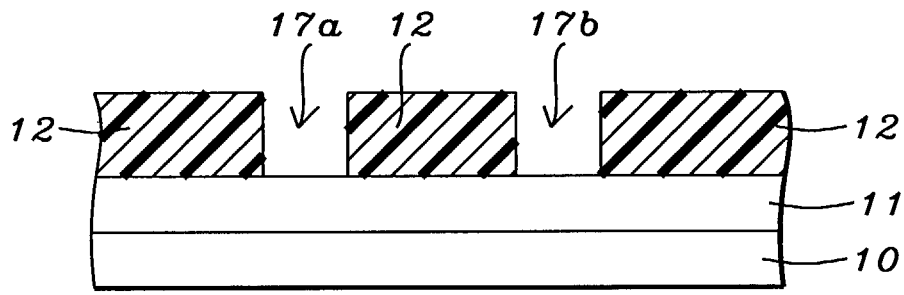
*FIG. 1b – Prior Art*
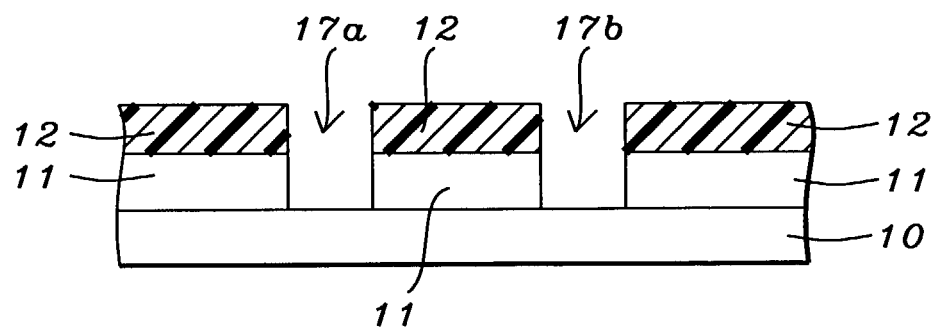
*FIG. 1c – Prior Art*

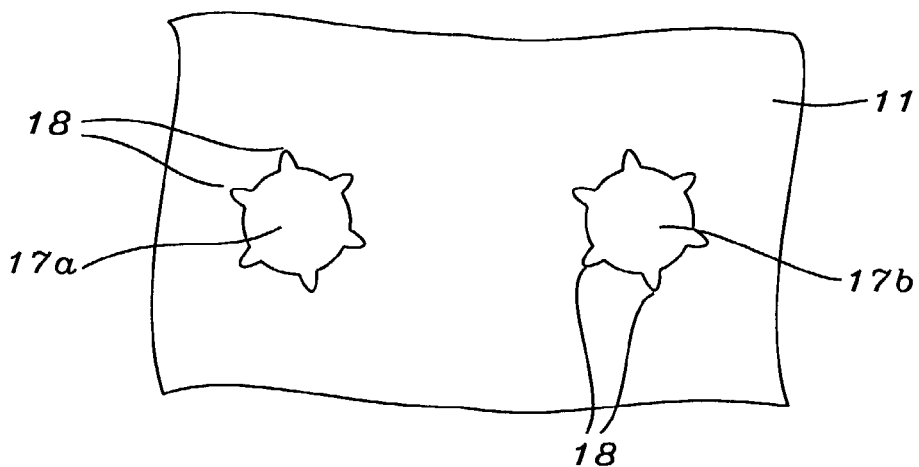
FIG. 1d – Prior Art
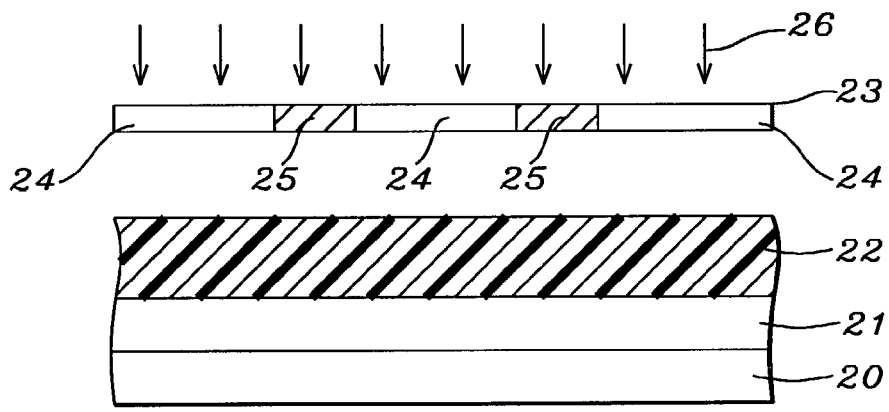
FIG. 2a
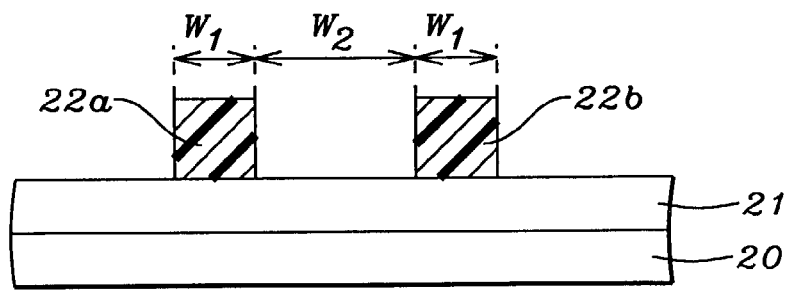
FIG. 2b

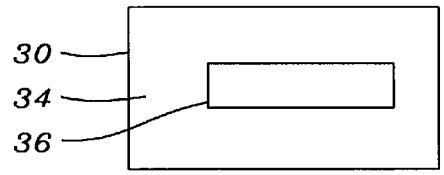
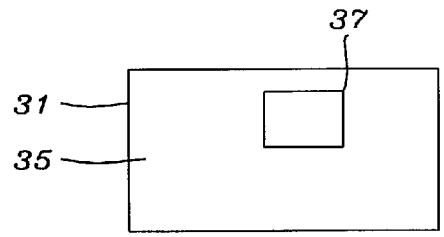
FIG. 4a    FIG. 4b
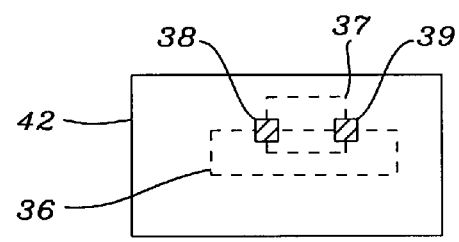
FIG. 4c
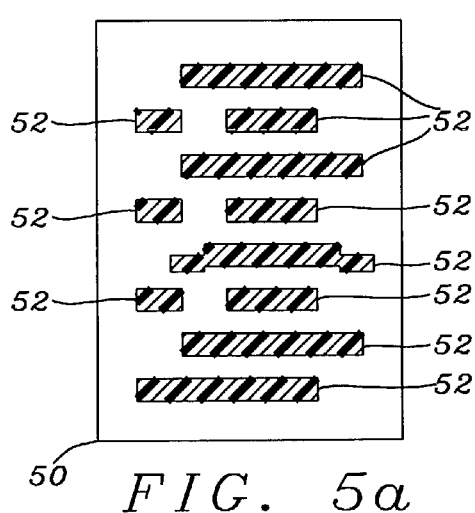
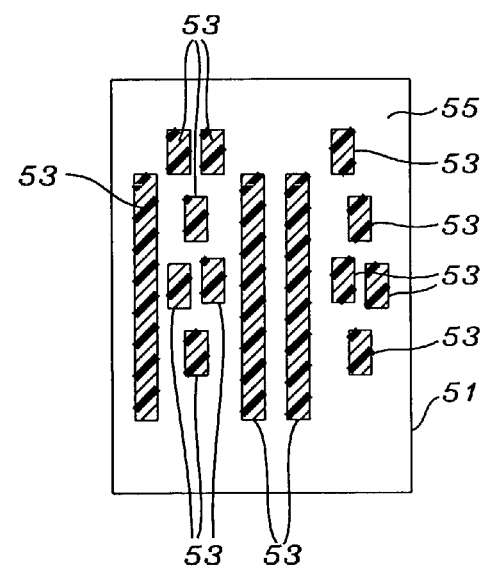
FIG. 5a    FIG. 5b

COMPLEMENTARY REPLACEMENT OF MATERIAL

FIELD OF THE INVENTION

The invention relates to the field of fabricating semiconductor devices and other electronic devices, and more particularly to an image reversal method of forming high resolution lithographic patterns that have high etch resistance.

BACKGROUND OF THE INVENTION

Two important processes that are repeated frequently during the manufacture of integrated circuits are photoresist patterning and etch transfer of the pattern into an underlying substrate. As the size of circuits shrinks in order to keep pace with demand for higher performance, the patterning and etching steps become more difficult and require a higher degree of control.

To achieve a higher resolution pattern in a photoresist, hereafter referred to as resist, the exposing wavelength has decreased according to an improvement predicted by the Raleigh equation, $R=k\lambda/NA$ where R is the resolution of a feature printed in a lithographic process, k is a process constant, $\lambda$ is the wavelength of radiation used to expose the resist, and NA is the numerical aperture of the exposure tool. With the progression of technology nodes that require an ever smaller critical dimension to be formed in a resist, the exposure wavelength has been continually decreasing. Typically, for technology nodes above 300 nm, i-line (365 nm) and Mid-UV (436 nm) radiation is preferably used. Deep UV exposures are preferred for the 130 nm, 180 nm, and 250 nm nodes while 193 nm radiation is the leading candidate for the 100 nm node.

Resolution enhancement techniques (RET) that effectively lower the k factor in the Raleigh equation have become popular in the industry. Off-axis illumination, phase shift masks, and optical proximity correction are a few of the widely accepted RETs. A phase shifted mask (PSM) such as the one described in U.S. Pat. No. 6,306,558 not only provides improved resolution but also enhances the depth of focus (DOF) during the patterning step. This particular PSM does not contain opaque material and therefore avoids problems commonly observed with conventional binary masks where a hole in an opaque region is printed as a defect in a resist layer. Further improvement is achieved by exposing through one PSM which has a 90° shift in one half of each contact hole and a 270° shift in the other half of each hole and then exposing through a second PSM with a similar feature except that the first half of a hole region is rotated 90° relative to the first half of a hole region in the first PSM.

Another method of improving process window during a lithography process is described in U.S. Pat. No. 6,337,175. A positive or negative resist is DUV patterned to give 180 nm L/S features. A water soluble polymer containing an acid generator and optionally a crosslinker is coated on the developed image. Then a second mask with a coarser pattern is used to selectively remove some of the resist lines. The method especially improves the DOF for forming isolated lines and also suppresses a proximity effect that occurs with conventional patterning where isolated or semi-isolated lines are printed at different sizes than dense lines even though the line sizes on the mask are the same.

Unfortunately, as higher resolution resists have been developed for shorter exposing wavelengths, the etch resistance of the polymer component has decreased and the capability of the resist to serve as an etch mask for a subsequent etch step has diminished. This trend is an even larger concern since the resist is usually coated at a thinner thickness as the $\lambda$ decreases in order to maintain an adequate process window during the pattern forming step. Generally, the resist thickness is no more than about 3 or 4 times the critical dimension or smallest feature size that is printed in the pattern. When the aspect ratio (feature height/feature width) becomes larger than about 3 or 4, then there is a tendency for line features to collapse during the develop and DI water rinse stage of pattern formation.

Usually, a high etch resistance has been associated with aromatic content in the polymer. Phenol groups that provide good dissolution character for Deep UV, i-line, and Mid UV resists also offer good resistance to plasma etch chemistries such as those involving fluorocarbon gases. However, for sub-200 nm exposure wavelengths like 193 nm, aromatic polymers are not useful because of a high optical absorbance. Instead, acrylate polymers and maleic anhydride/cyclic olefin (COMA) copolymers are being developed for their good lithographic properties. Although COMA copolymers are better than acrylates in terms of etch resistance, they are no match for aromatic polymers in DUV and i-line resists. It is possible that better materials can be developed for 193 nm and other sub-200 nm exposing technologies such as 157 nm, but a method is needed immediately that will allow current 193 nm resists to be incorporated into manufacturing schemes.

A large majority of Deep UV and sub-200 nm lithography processes are based on a chemically amplified (CA) resist mechanism in which one photon causes many chemical events in a resist layer. The amplified nature of a CA resist provides for higher throughput during the exposure process but is susceptible to a larger line edge roughness (LER). LER is evident during top-down views through a scanning electron microscope (SEM) inspection that is typically performed during the manufacturing process to ensure that the exposure dose and focus setting for the resist exposure are providing a quality image with the correct feature size. Frequently, jagged edges on a resist line can be seen through an SEM. This type of defect is unacceptable because the LER will be transferred into an underlying substrate and will degrade device performance. In the case of contact holes, a so-called "bird's beak" problem is evident in which pointed edges protrude from the circular opening formed in a substrate. The higher contrast property in mature CA resists that enables a high resolution feature to be printed also leads to a larger LER, especially for 193 nm exposures. Therefore, a method that can take advantage of a high resolution pattern and overcome deficiencies such as LER and bird's beak defects during an etch transfer of the pattern into a substrate is highly desirable.

FIGS. 1a-1d depict a prior art method of forming contact holes in a resist and transferring the pattern into an underlying layer. A dielectric layer 11 is formed on a substrate 10 as shown in FIG. 1a. A resist solution is coated and baked to form layer 12 and is then exposed to radiation 16 through a mask 13 containing regions 14, 15. When mask 13 is a binary type, region 14 represents an opaque coating on a transparent substrate while region 15 is transparent substrate. If mask 13 is a phase shifting type, then region 14 transmits light that is 180° out of phase with light transmitted through region 15. After exposed resist 12 is developed in aqueous base, contact holes 17a, 17b are generated as shown in FIG. 1b. This resist pattern serves as an etch mask for transferring the hole openings 17a, 17b into the dielectric layer 11 as depicted in FIG. 1c. A considerable amount of resist thickness is usually lost during this step. After the resist 12 is stripped, a top view of the resulting contact holes 17a, 17b in dielectric layer 11 as shown in FIG. 1d indicates jagged edges or bird's beaks 18 as a result of a low etch resistance of photoresist 12 and edge roughness in the resist pattern. This result is likely to occur when the pattern resist is a 193 nm sensitive composition or when the space width of the holes 17a, 17b is near the resolution limit of the lithographic process.

A method found in U.S. Pat. No. 5,950,106 provides for improved etch resistance by coating a spin-on glass (SOG) layer beneath a resist layer. The SOG is hardened at 430° C. prior to coating the resist and is comprised of $Si_xO_y$. The etch properties of the SOG enable a thinner resist layer that leads to a larger process window. The patterned resist serves as an etch mask during a fluorine based plasma etch through the SOG. Then a chlorine based plasma etches through an underlying metal layer and also removes the resist. The SOG etches 10 times faster than the resist during the initial etch while the reverse is true during the second etch step. While this method is successful when an i-line resist is employed, the LER associated with sub-200 nm resists and some DUV exposed patterns could be transferred into the substrate during the etch steps.

A method cited in U.S. Pat. No. 5,376,227 avoids etch issues associated with CA resists by patterning an inorganic layer comprised of $Ge_xSe_{1-X}$. The method involves a photo-doping process in which Ag ions from an underlying $Ag_2S/AgS_2Se_3$ layer migrate to the $Ge_xSe_{1-X}$ layer in exposed regions. The patterned top layer then functions as an etch mask for transferring the pattern through underlying layers. Additionally, better planarization is achieved by coating the inorganic resist by a RF sputtering technique.

SUMMARY OF THE INVENTION

An objective of the present invention is to provide a method for forming a high resolution contact or via hole pattern with smooth edges and having excellent etch resistance that can be etch transferred into an underlying substrate with high fidelity. The method prevents the bird's beak problem associated with resist patterns that have low etch resistance or high line edge roughness.

A further objective of the present invention is to provide a method for forming a trench pattern with smooth edges and high etch resistance that can be transferred into an underlying layer such as a dielectric layer in a via first dual damascene process.

A still further objective of the present invention is to provide a method for forming a high resolution line pattern with low edge roughness and high etch selectivity that can be successfully used as an etch mask to form polysilicon gates.

A still further objective of the present invention is to provide an image reversal method that can be applied to a variety of exposure techniques including those employing direct write electron beam tools, projection aligners, and proximity aligners. It will also be desirable for the method to be compatible with the following resolution enhancement techniques: phase shifting masks; annular, dipole, or quadruple illumination; and scattering bars or other assist features.

According to one embodiment, a high resolution contact hole pattern having high etch resistance can be fabricated by first coating a resist layer on a dielectric layer that has been formed on a substrate. Although a conventional binary or phase shifting mask can be used to expose the resist which is preferably a positive tone composition, a pattern comprised of resist islands is preferably formed in two exposures with a phase edge mask having orthogonal phase edges or with two binary masks having orthogonal opaque lines. This process provides a large DOF and forms high resolution islands at the sites where contact holes are desired. A material with a high etch resistance is then coated on the patterned resist in a manner that does not attack the resist. This complementary replacement material (CMR) layer can be formed by spin coating or a chemical vapor deposition technique to deposit a planar layer. An etch is performed that removes the patterned resist at a faster rate than the CMR layer and thereby forms contact holes in the CMR layer at the locations formerly occupied by resist islands. The CMR layer remaining on the substrate serves as an etch mask for transferring the hole pattern into the dielectric layer without striations (bird's beaks). The resist pattern can also be created with masks having orthogonal opaque lines and assist lines in two exposures.

In a second embodiment, a via hole pattern in a damascene stack comprised of a top dielectric layer and a bottom etch stop layer is provided on a substrate. A resist is coated on the dielectric layer and is patterned by using a phase edge mask to give a high contrast resist line with large DOF. The line occupies a region over the via holes that will become a trench in the damascene structure. A CMR layer similar to the one described in the first embodiment is coated over the patterned resist. An etch is performed which removes the patterned resist at a faster rate than the CMR layer. As a result, a trench opening is formed in the CMR layer and this opening can be transferred into the dielectric layer in a subsequent etch step. The CMR layer is stripped and the dual damascene structure is completed by a conventional process sequence. Smooth edges on the CMR pattern minimize roughness on the sidewalls of the trench opening in the dielectric layer. A thinner photoresist layer can be coated that will enable a larger process window. Additionally, the photoresist that fills the via is not removed by developer and avoids scumming and poisoning problems that often occur when removing resist from via holes during trench patterning.

A third embodiment involves fabrication of polysilicon gates with a CMR layer. Preferably, a negative mask and a positive tone photoresist are used to form trench patterns on a polysilicon substrate. A trench occupies a position that is intended to be a polysilicon gate in the final device. A CMR layer similar to the one described in the first embodiment is coated on the pattern to fill the trenches and form a planar layer on the resist. An etch is performed that removes the resist at a faster rate than the CMR layer. As a result, a line pattern comprised of a CMR layer is produced above the polysilicon layer. A subsequent etch forms polysilicon gates by using the highly etch resistant CMR layer with smooth sidewalls as an etch mask. Optionally, a direct write exposure tool is used to pattern the resist. Image reversal by applying this CMR method is an advantage since opposite polarity photoresists that are required for some direct write schemes are not available. Furthermore, the high etch resistance offered by the CMR layer relaxes the etch requirement placed on the resist.

BRIEF DESCRIPTION OF THE DRAWINGS

FIGS. 1a-1c are cross-sectional views showing a conventional process of forming contact holes in a substrate such as a dielectric layer.

FIG. 1d is a top-down view of the structure shown in FIG. 1c after the resist is removed when pattern transfer is complete.

FIGS. 2a-2d are cross-sectional views of a method for forming contact holes in a substrate according to the present invention.

FIGS. 4a-4b are top views of two mask patterns that are used to form a resist island and an unwanted resist island in FIG. 4c.

FIG. 6a and FIG. 5b are top views of masks used to form resist islands shown in FIG. 6b.

DETAILED DESCRIPTION OF THE INVENTION

Preferred embodiments of the present invention will be described with reference to the accompanying drawings. Numbered elements are not necessarily drawn to scale and are not intended to limit the scope of the invention.

Figure 2C:
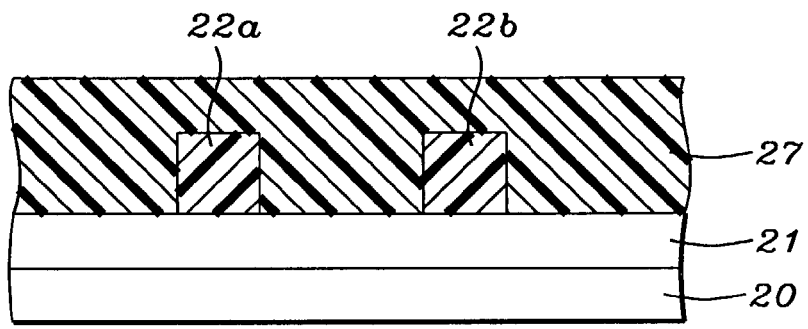

FIGS. 2a-2e are drawings showing a method of forming a pattern with high resolution contact holes and transferring the pattern into an underlying layer according to the first embodiment of the present invention. Referring to FIG. 2a, a dielectric layer 21 is formed on substrate 20. Substrate 20 may contain conducting layers and other dielectric layers (not shown). Dielectric layer 21 is typically $SiO_2$ or a low k dielectric material such as fluorine doped $SiO_2$, carbon doped $SiO_2$, fluorosilicate glass (FSG) or Applied Materials' "Black Diamond" that is deposited with a CVD or plasma enhanced CVD (PECVD) technique. Optionally, commercially available spin-on dielectrics such as FLARE from Allied Signal and SiLK from Novellus can be used.

A resist solution is coated and baked to form layer 22. Resist 22 is preferably a positive tone composition. In a positive tone resist, exposed regions become soluble in a developer and are washed away while unexposed regions remain on the substrate. With a negative tone resist, exposed regions become insoluble in developer and remain on the substrate while unexposed regions are washed away. Resist 22 is exposed with radiation 26 through a mask 23. Radiation 26 can be one or more wavelengths in a range from about 13 nm to about 500 nm. Generally, 193 nm radiation or Deep UV (248 nm) radiation is employed for printing holes that have a width in the range of about 100 nm to about 200 nm.

When a mask is employed in an imaging process, a projection aligner or a proximity aligner can be used. A projection aligner projects the mask image through a lens to produce an aerial image on a resist layer and can be a full-field exposure tool, step-and-repeat tool, or a step-and-scan tool. A proximity aligner does not use an imaging lens and the aerial image on the resist layer is a direct diffraction from the mask. The resist is in close proximity to the mask and sometimes directly contacts the mask.

When the mask 23 in FIG. 2a is binary, region 24 is comprised of a transparent substrate like quartz while region 25 consists of an opaque coating such as chrome on the transparent substrate. However, a phase shifting mask (PSM) has a lower diffraction than chrome and provides a larger process window for printing high resolution features. When mask 23 is a PSM, region 24 transmits light that is 180° out of phase with light that is transmitted through region 25. The phase shift is produced by an attenuator material such as $MoSiO_XN_Y$ on substrate 24 in regions 25 in the case of an attenuated PSM or by etching the substrate 24 to different depths in the example of an alternating PSM.

FIG. 2b shows the results of exposing a positive tone resist 22 with mask 23. After exposed resist 22 is developed in an aqueous base, resist islands 22a and 22b are formed at locations corresponding to the desired placement of contact holes. The distance $w_2$ between islands 22a and 22b can vary within the resist pattern. In some regions of the pattern, $w_2$ is about the same size as $w_1$ while in other regions $w_2$ can be several times the size of $w_1$. Furthermore, the number of islands formed may vary such that some regions may contain only isolated islands while other regions have dense arrays of islands extending in both x and y directions on an (x,y) grid that is bounded by the edge of the substrate.

Referring to FIG. 2c, a key feature of the invention is the coating of a complementary replacement material (CMR) layer 27 on the patterned photoresist islands 22a, 22b. The CMR layer 27 is comprised of a material such as an organic polymer or fluorosilicate glass (FSG) that has a high etch resistance compared to islands 22a, 22b. High etch resistance refers to plasma etches comprised of fluorocarbon/$O_2$ mixtures for etching organic layers and fluorocarbon gas mixtures that are normally employed to etch dielectric layers. CMR layer 27 is applied in a manner including spin-on and CVD techniques that does not attack islands 22a, 22b. When an organic polymer and solvent are spin coated to form CMR 27, the solvent is preferably not of similar polarity to the solvent in the resist composition used to coat resist layer 22 so that the CMR solvent does not partially dissolve islands 22a, 22b. The bake temperature for removing the CMR solvent from the coated layer 27 should not be higher than the glass transition temperature (Tg) of islands 22a, 22b so that the islands do not distort during the bake process. Likewise, during a CVD deposition of CMR layer 27, the temperature in the CVD chamber must not exceed the Tg of resist islands 22a, 22b. The coating of the CMR is optimized to a thickness that provides a planar layer 27.

Figure 2D:
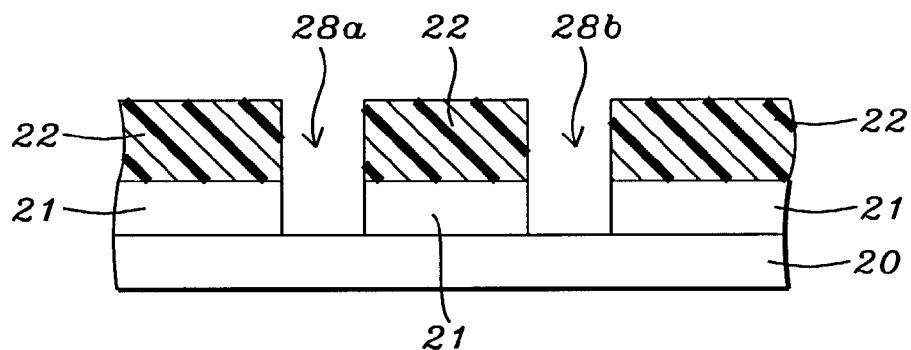

Referring to FIG. 2d, an etch is performed that removes the top portion of the CMR layer 27 at a uniform rate in all regions of the pattern. When resist islands 22a, 22b are exposed to the etch, the rate of removing islands 22a, 22b is significantly faster than the removal rate of remaining CMR layer 27. As a result, a hole 28a is formed in the CMR layer 27 in a location previously occupied by island 22a. Similarly, hole 28b is formed in a location that was previously island 28b. Once the resist islands 22a, 22b are removed, the etch conditions may be changed to optimize the etch rate ratio of dielectric layer 21 to CMR layer 27. Preferably, the etch transfer of holes 28a, 28b into dielectric layer 21 is performed in the same chamber as the etch that forms holes 28a, 28b. The dielectric etch continues until holes 28a, 28b are completely transferred through dielectric layer 21. Optionally, an etch stop layer (not shown) may be deposited on substrate 20 before deposition of layer 21 in FIG. 2a to prevent the dielectric etch from damaging the substrate near the end point of the etch.

Figure 2E:
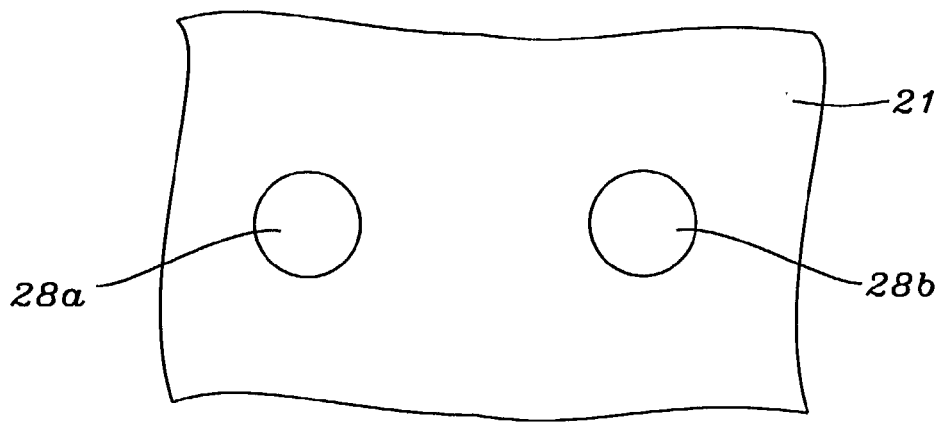
FIG. 2e is a top-down view of the structure in FIG. 2d after pattern transfer is complete and the CMR layer is removed.

FIG. 2e is a top view of the structure in FIG. 2d after the CMR layer 27 has been stripped by an appropriate method known to those skilled in the art. An oxygen ashing is typically preferred for organic polymers while a FSG layer is removed by a plasma etch employing a $C_XF_Y$ chemistry such as $CF_4$ or $C_2F_6$. Note that smooth edges on holes 28a, 28b are formed in dielectric layer 21 unlike prior art methods that tend to produce bird's beak defects as depicted in FIG. 1d. The improved method of the present invention eliminates the etch requirement placed on resist patterns in conventional methods and transfers the etch requirement to a CMR layer that is selected for its high etch resistance. Thus, a pattern having high resolution and excellent etch resistance is fabricated in a CMR layer that can be anisotropically transferred into an underlying layer to provide features with low edge roughness.

Figure 3A:
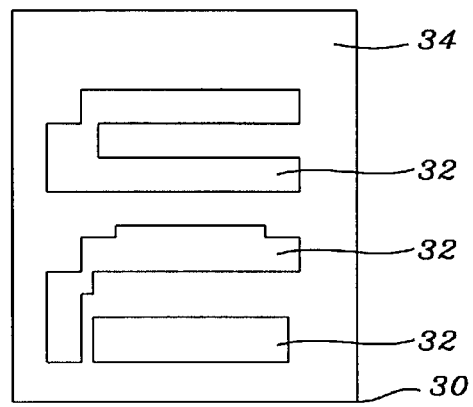
FIGS. 3a-3b are top views of two mask patterns that are used to form the resist islands shown in FIG. 3c.
Figure 3B:
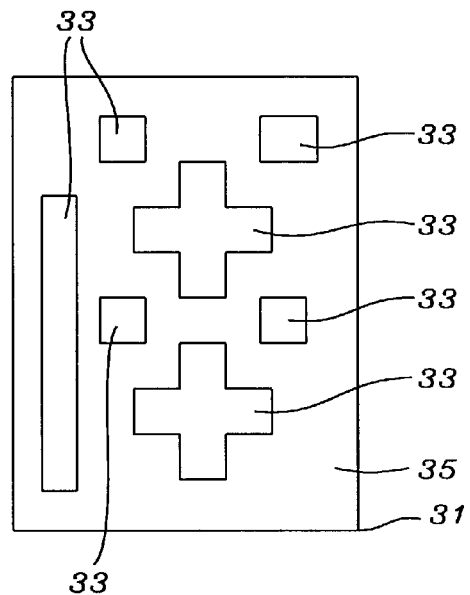
Figure 3C:
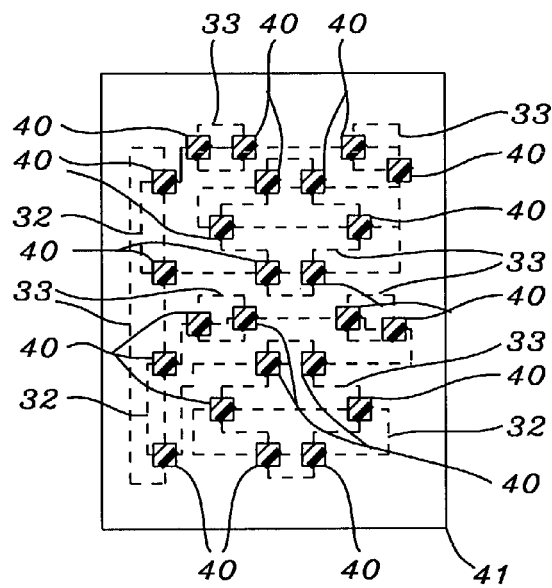

FIGS. 3a-3b represent two mask patterns that offer an alternate method of printing resist islands shown in FIG. 3c that takes advantage of the high resolution and large DOF provided by phase edge masks. Referring to FIG. 3a, mask 30 contains regions 32 that are bounded by dark lines representing phase edges. Region 34 is comprised of transparent substrate. Mask 31 in FIG. 3b is similar to mask 30 and has regions 33 bounded by dark lines representing phase edges. Region 35 consists of transparent substrate. Resist 22 in FIG. 2a is first exposed through mask 30 in FIG. 3a and is then exposed with mask 31 in FIG. 3b followed by developing in aqueous base to form islands 40 on substrate 41 shown in FIG. 3c. Islands 40 are superimposed on the patterns of masks 30 and 31 to demonstrate how an island 40 is formed where orthogonal phase edges meet. Islands 22a, 22b in FIG. 2b can be equivalent to any two adjacent islands 40 in FIG. 3c.

The phase edges exist as closed loops except when some of the edges in the loop are outside the mask exposure area. There are situations when a single hole needs to be delineated in a given region and a single island 22a or 40 must be printed in a resist layer. In some cases, phase edge loops create an unwanted resist island in the pattern. FIG. 4a shows a portion of mask 30 containing a region bounded by phase edges represented by rectangle 36 while FIG. 4b shows a portion of mask 31 containing a region bounded by phase edges represented by rectangle 37. Island 38 is formed on substrate 42 where one pair of orthogonal phase edges 36, 37 meets and unwanted island 39 is formed where another pair of orthogonal phase edges 36, 37 meets. This extra island 39 can be avoided in some patterns by cleverly routing the phase edges as shown in FIG. 3c. However, in some cases after all attempts to avoid designing an unwanted island in the pattern are exhausted, the unwanted island 39 can be removed by a third exposure involving a binary mask or an attenuated mask that can produce a spot exposure.

Figure 5C:
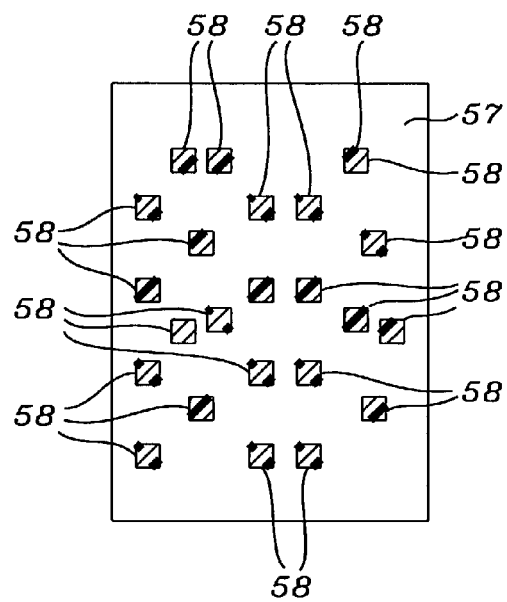
FIGS. 5a-5b are top views of masks with opaque line patterns that are used to form the resist islands shown in FIG. 5c.

Another way to produce high resolution, large DOF islands 22a, 22b is to superimpose two exposures using orthogonally separated opaque lines as shown in FIGS. 5a-5b. The image contrast and DOF of opaque lines are much better than those of either contact holes or opaque islands. Lines result in a lower diffraction of exposing light than holes. Exposing the opaque lines separately preserves these characteristics. Resist 22 as depicted in FIG. 2a is first exposed with binary mask 50 in FIG. 5a having opaque lines 52 on a transparent substrate 54 and is then exposed with binary mask 51 in FIG. 5b containing opaque lines 53 on transparent substrate 55. The resist 22 is developed to produce islands 58 which are formed at sites where a line 52 overlaps a line 53 as shown in FIG. 5c. All other resist regions are exposed at least once through mask substrate 54 or 55 and are washed away in developer to give a clear substrate 57 next to resist islands 58. Note that the opaque line masks can be designed to generate the same islands that are produced by superimposing two phase edge mask exposures. Islands 22a, 22b in FIG. 2b are equivalent to any two adjacent islands 58 in FIG. 5c.

Figure 6A:
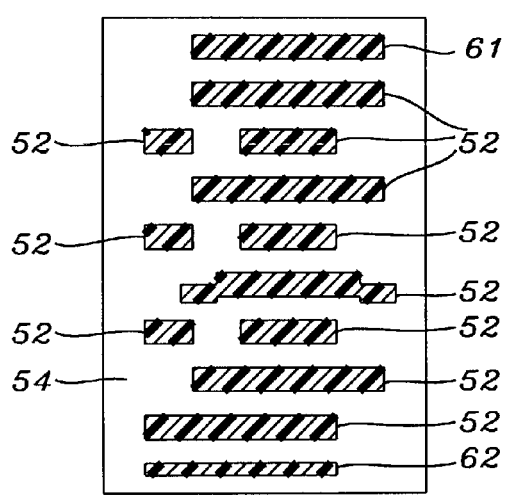
FIG. 6a shows the mask in FIG. 5a with two assist lines added.
Figure 6B:
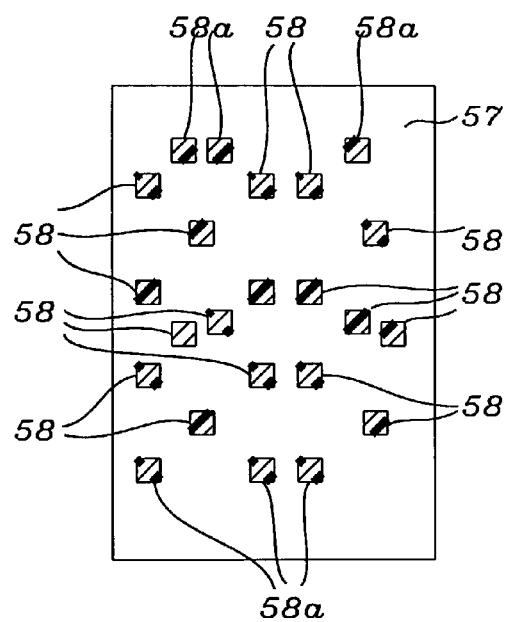

Control of critical dimension (CD) $w_1$ and DOF for the lithographic process can be further improved by employing resolution enhancement techniques (RETs). For example, sub-resolution or full size scattering bars in masks 50, 51 can be used to print patterns with smaller pitches which is equivalent to a smaller ($w_1+w_2$) in FIG. 2b. Additionally, annular, QUASAR, or dipole illumination can be used in combination with RETs to enhance the aerial image that exposes resist 22 in FIG. 2a. High resolution islands 58, 58a in FIG. 6b can therefore be printed by first exposing resist 22 with mask 60 in FIG. 6a containing opaque lines 52 and assist lines including full size scattering bar 61 and sub-resolution scattering bar 62 and then exposing resist 22 with mask 51 in FIG. 5b containing opaque lines 53. The resist 22 is developed to produce the same pattern of islands 58 shown in FIG. 5c except that $w_1$ and $w_2$ for islands 58a in FIG. 6b can be made smaller relative to $w_1$ and $w_2$ for islands 58 in this example.

In a second embodiment the present invention is a method of forming high resolution polysilicon gates with smooth sidewalls as illustrated in FIGS. 7a-7d. A substrate 70 is provided in FIG. 7a that is comprised of a material such as silicon that contains active regions separated by isolation regions (not shown). A gate dielectric layer that normally consists of $SiO_2$ which is grown on active regions is not shown in order to simplify the drawing and focus attention on the key features of the present embodiment. A polysilicon layer 71 is deposited by conventional means such as a CVD technique. Optionally, an anti-reflective coating (ARC) which is not shown is coated on the polysilicon 71 to control reflectivity during a subsequent patterning step. A resist solution is coated on the polysilicon layer 71 and baked to form resist layer 72.

The resist 72 is exposed with radiation 76 comprised of one or more wavelengths in the range of about 13 nm to about 500 nm through mask 73. Mask 73 is depicted as a negative mask comprised of a transparent substrate 74 with a majority of the surface covered with an opaque coating 75. In this application, a positive tone resist provides the best aerial image for exposing resist 72. The pattern on the mask results in trenches at locations in resist 72 that will become polysilicon gates in the final device.

Figure 7A:
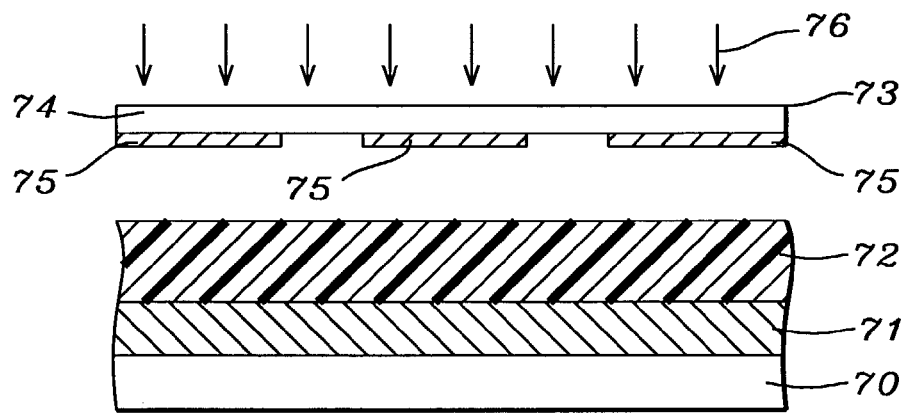
FIGS. 7a-7d are cross-sectional views of a method for forming polysilicon gates according to an embodiment of the present invention.
Figure 7B:
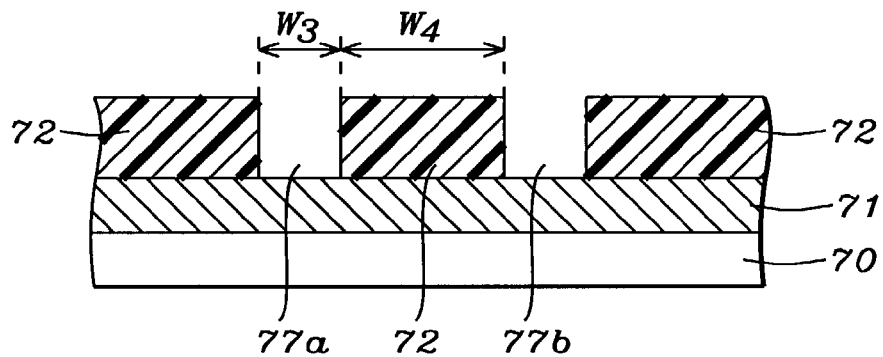

Referring to FIG. 7b, the exposed resist 72 is developed in aqueous base to generate trenches 77a, 77b. The space width $w_3$ within the trenches can be as small as 100 nm or less and the distance between trench openings $w_4$ can vary within the pattern. Some regions may have a $w_4$ that is nearly equal to $w_3$ while other regions have a $w_4$ that is several times larger than $w_3$. The number of trenches 77a, 77b may also vary within different regions of the pattern. As few as one trench may be formed in isolated trench regions while many trenches may be present in other regions.

Figure 7C:
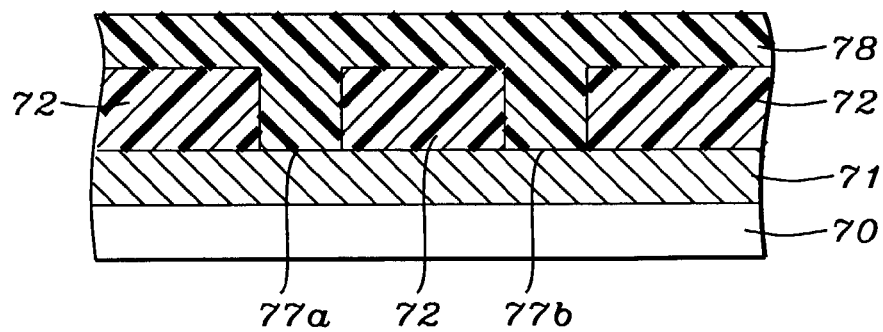

Referring to FIG. 7c, a key feature of the invention is that a complementary replacement material (CMR) layer 78 is coated on patterned resist 72 and also fills trenches 77a, 77b. The CMR layer 78 is comprised of a material such as an organic polymer or fluorosilicate glass (FSG) that has a high etch resistance compared to resist 72. High etch resistance refers to plasma etches generated from fluorocarbon/$O_2$ mixtures that etch organic layers and from $Cl_2$, $CCl_4$, or HBr gases that are normally employed to etch a polysilicon layer. CMR layer 78 is applied in a manner including spin-on and CVD techniques that does not attack resist 72. When an organic polymer and solvent are spin coated to form CMR 78, the solvent is preferably not of similar polarity to the solvent in the resist composition used to coat resist layer 72 so that the CMR solvent does not partially dissolve the sidewalls in trenches 77a, 77b or mix with layer 72. The bake temperature for removing the CMR solvent from the coated layer 78 should not be higher than the glass transition temperature (Tg) of resist 72 so that the trenches 77a, 77b do not distort during the bake process. Likewise, during a CVD deposition of CMR layer 78, the temperature in the CVD chamber must not exceed the Tg of resist 72. The coating of the CMR material is optimized to a thickness that provides a planar layer 78.

Figure 7D:
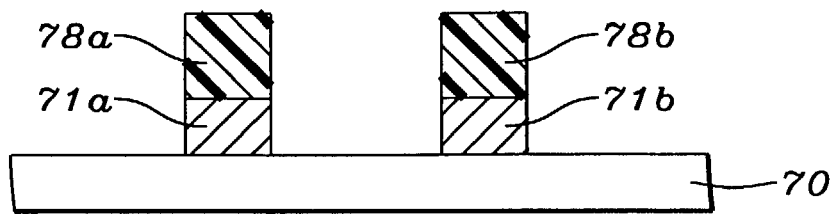

In FIG. 7d a conventional etch is performed that removes the top portion of the CMR layer 78 at a uniform rate in all regions of the pattern. When a sufficient amount of CMR 78 is removed, resist layer 72 becomes exposed to the etch. The etch rate of removing resist 72 is significantly faster than the removal rate of remaining CMR layer 78. As a result, a line 78a is formed in the CMR layer 78 in a location previously occupied by trench 77a. Similarly, line 78b is formed in a location that was previously trench 77b. Once all of resist 72 is removed which can be determined by an end point detect method, the etch conditions are changed to optimize the etch rate ratio of polysilicon layer 71 to CMR lines 78a, 78b. Preferably, the etch transfer of lines 78a, 78b through polysilicon 71 is performed in the same chamber as the etch that forms lines 78a, 78b. The polysilicon etch continues until lines 71a, 71b are formed. Optionally, a subsequent etch can be performed at this point to etch into an underlying gate dielectric layer (not shown) at the top of substrate 70. Remaining lines 78a, 78b are then stripped by a method known to those skilled in the art. Conventional methods are followed to complete the fabrication of a device such as a transistor and are not included here.

The method of this embodiment is an improvement over prior art in that the imaging properties of the photoresist can be selected without regard to the etch properties. For example, with 193 nm sensitive resists used to make poly gate widths of 100 nm or less, the preferred polymer in the resist composition is a polyacrylate that has poor etch resistance. This method takes advantage of the higher resolution capability of poor etch resistant materials and transfers the etch requirement to the CMR layer that is selected because of its high etch resistance. Thus, a pattern having high resolution and high etch resistance can be formed in a CMR layer that is capable of being anisotropically transferred into the underlying polysilicon. Polysilicon gates with small linewidths and smooth edges and sidewalls are thereby produced. The method is compatible with resolution enhancement techniques described in the first embodiment which can further reduce the gate linewidth and increase the process window of the printed features.

Since this embodiment is an image reversal method, it is valuable with a direct write lithography technique where the exposure process is time consuming and the writing time is a function of the number of patterns to be printed on a wafer. There are many situations where writing time can be saved by reversing the image because of a reduction in the number of patterns to be printed. Reversal is usually accomplished by using a resist of the opposite polarity but often such a resist is not readily available. A CMR layer offers another way of reversing polarity and has the added property of high etch resistance. In the direct write application, the pattern shown in FIG. 7b is generated without the use of a mask. Otherwise, the sequence of fabricating a polysilicon gate is the same as shown in FIGS. 7b-7d.

In a third embodiment the present invention is a method of forming trenches such as in a via first dual damascene process as depicted in FIGS. 8a-8d. A substrate 80 is provided in FIG. 8a that is comprised of dielectric and conducting layers (not shown). An etch stop layer 81 consisting of a material such as silicon carbide, silicon nitride or silicon oxynitride is deposited by a CVD or PECVD method. A dielectric layer 82 is deposited and via holes 83a and 83b are formed by conventional methods. Although two holes are shown in this example, the via hole pattern in layer 82 can include dense hole regions and isolated hole regions. Dielectric layer 82 is selected from a group including $SiO_2$ and low k dielectric materials such as fluorine doped $SiO_2$, carbon doped $SiO_2$, FSG, and borophosphate silicate glass. Optionally, an etch stop layer (not shown) may be deposited on layer 82 prior to via hole patterning to serve as an etch stop for a subsequent chemical mechanical polish (CMP) step.

A resist solution is coated on the dielectric layer 82 and baked to form resist layer 84 that also fills holes 83a, 83b. The resist 84 is exposed through a mask 85 with radiation 88 comprised of one or more wavelengths from a range between about 13 nm and 500 nm. Mask 85 is a phase edge type having phase edges 86, 87 that enable a higher resolution pattern with larger process window to be achieved than with binary masks. The resist 84 can be either positive or negative tone and the appropriate tone is selected that together with the mask will provide the largest process window for the patterning process.

Figure 8A:
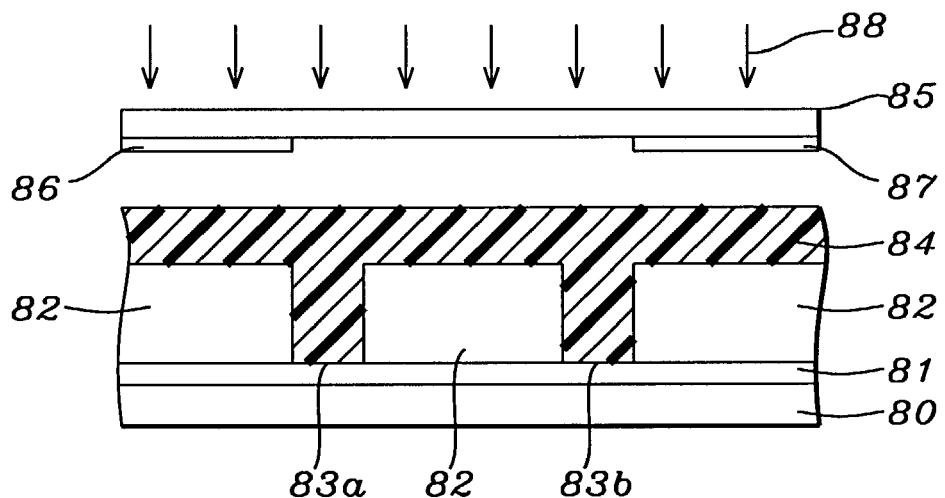
FIGS. 8a-8d are cross-sectional views of a method for forming a trench pattern in a via first dual damascene process according to an embodiment of the present invention.
Figure 8B:
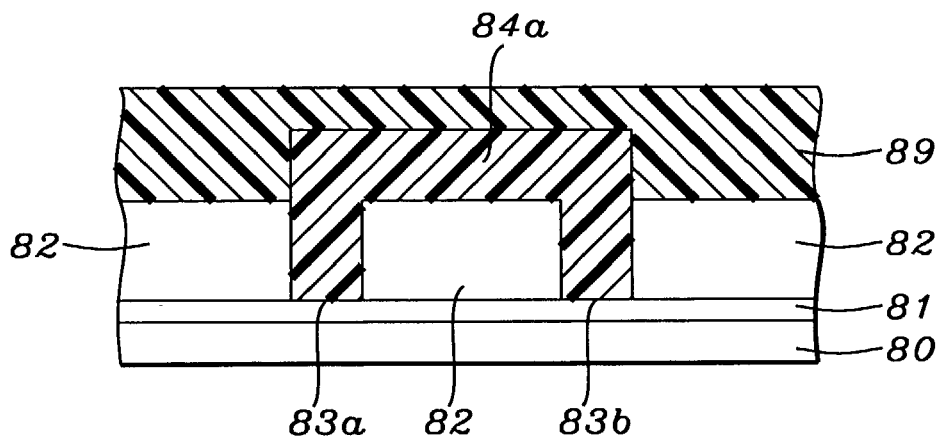

Referring to FIG. 8b, exposed resist 84 in FIG. 8a is developed to provide a pattern comprised of a line 84a aligned above via holes 83a, 83b. In this particular case, one line is formed above two via holes 83a, 83b but the design may vary. For example, the design could involve one line above each via hole or one line above more than two via holes. In any case, the location of the line 84a is intended to become a trench in the final device.

Note that line 84a also fills the underlying via holes 83a, 83b. This is an advantage over prior art in which a via first dual damascene process normally involves forming a trench opening above one or more via holes and removing resist from the via holes with aqueous base developer. Resist is difficult to completely remove from the holes and often forms scum or residue at the bottom of the holes. Additionally, if resist 84 is a CA resist, it can be poisoned by traces of amines within dielectric layer 82 that hinder the chemical amplification mechanism and prevent the exposed resist 84 within holes 83a, 83b from being converted to soluble material that can be removed by developer. In this embodiment, resist line 84a is intended to remain in holes 83a, 83b and problems associated with incomplete removal of exposed resist within via holes are avoided.

A CMR layer 89 similar to the one described in the first two embodiments is then coated on the patterned resist line 84a. The CMR layer 89 is comprised of a material such as an organic polymer or fluorosilicate glass (FSG) that has a high etch resistance compared to resist line 84a. High etch resistance refers to plasma etches consisting of fluorocarbon/$O_2$ mixtures that etch through organic layers and to fluorocarbon gas mixtures that are normally employed to etch dielectric layers. CMR layer 89 is applied in a manner including spin-on and CVD techniques that does not attack resist line 84a. When an organic polymer and solvent are spin coated to form CMR 89, the solvent is preferably not of similar polarity to the solvent in the resist composition used to coat resist layer 84 so that the CMR solvent does not partially dissolve resist line 84a. The bake temperature for removing the CMR solvent from the coated layer 89 should not be higher than the glass transition temperature (Tg) of line 84a so that the line is not distorted during the bake process. Likewise, during a CVD deposition of CMR layer 89, the temperature in the CVD chamber must not exceed the Tg of resist line 84a. The coating of the CMR is optimized to a thickness that provides a planar layer 89.

Figure 8C:
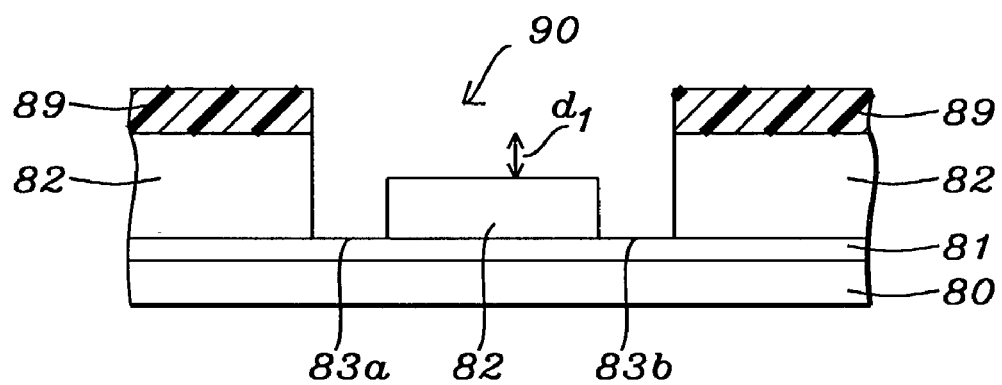

In FIG. 8c, an etch is performed that removes the top portion of the CMR layer 89 at a uniform rate in all regions of the pattern. When resist line 84a becomes exposed to the etch, the rate of removing line 84a is significantly faster than the removal rate of remaining CMR layer 89. As a result, a trench opening 90 is formed in the CMR layer 89 in a location previously occupied by line 84a. Although all of line 84a is removed above dielectric layer 82 at this point, resist line 84a remains in via holes 83a, 83b. The etch conditions are now normally changed to optimize the etch rate ratio of dielectric layer 82 to CMR layer 89. Preferably, the etch transfer of trench 90 into dielectric layer 82 is performed in the same chamber as the etch that forms trench opening 90 in CMR layer 89. The dielectric etch is typically a timed etch that produces a depth $d_1$ of trench 90 in dielectric layer 82. Meanwhile, resist 84a continues to be removed from holes 83a, 83b but some remains in the bottom of the holes to protect the etch stop 81 from being attacked by the dielectric etch. Those skilled in the art are aware of the etch conditions required for damascene processing and they are not described here. Once a depth $d_1$ for trench 90 has been achieved, the dielectric etch ends and the remainder of line 84a in holes 83a, 83b is removed typically by an ashing step and CMR layer 89 is stripped by an appropriate method.

This method takes advantage of the higher resolution capability of poor etch resistant materials and transfers the etch requirement from the resist to the CMR layer that is selected because of its high etch resistance. Thus, a trench pattern having high resolution and high etch resistance can be formed in a CMR layer that is capable of being anisotropically transferred into the underlying dielectric layer. Trenches with small linewidths and smooth edges and sidewalls are thereby produced. The method is compatible with resolution enhancement techniques described in the first embodiment which can further reduce the trench width and increase the process window of the printed features.

Figure 8D:
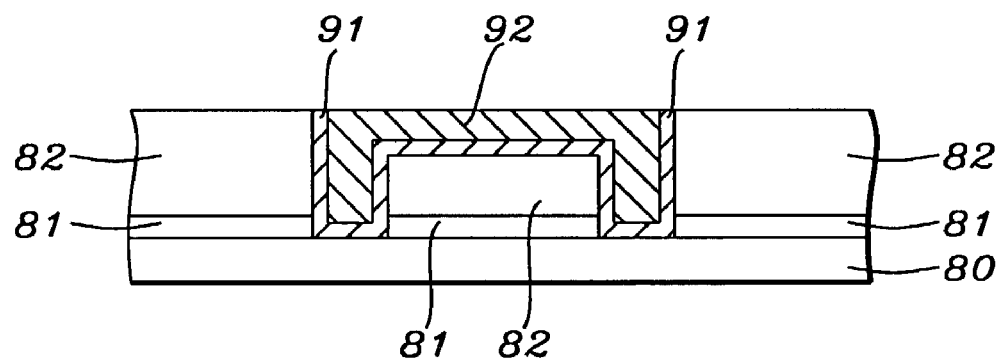

Referring to FIG. 8d, conventional methods are followed to complete the dual damascene structure. Etch stop 81 is removed from the bottom of holes 83a, 83b and a barrier metal liner 91 comprised of a material such as TiN, TaN, WN, TiW, Ti, Ta, or W is deposited. Then a metal 92 such as copper, a copper alloy, aluminum or an Al alloy is deposited by a sputtering, electroplating, or CVD technique. The level of metal 92 is lowered by a planarizing step such as CMP such that metal 92 is coplanar with the top of dielectric layer 82 or with the top of an etch stop layer (not shown) above layer 82 if that option is employed.

While this invention has been particularly shown and described with reference to, the preferred embodiments thereof, it will be understood by those skilled in the art that various changes in form and details may be made without departing from the spirit and scope of this invention.

We claim:

1. A semiconductor processing method comprising:
    (a) providing a substrate;
    (b) patterning a resist layer on said substrate to form a resist pattern;
    (c) coating a complementary replacement material (CMR) layer on said resist pattern; and
    (d) performing a single etch step to etch all of said resist pattern and a portion of said CMR layer to form an image reversal pattern in said CMR layer, wherein said CMR layer has a lower etch rate than said resist layer such that the resist layer is etched faster than the CMR layer when the CMR layer above a surface of the resist pattern is etched to expose the surface of the resist pattern in the single etch step.

2. The method of claim 1 wherein the resist pattern is delineated with a mask selected form a group consisting of binary, phase shifting and phase edge masks.

3. The method of claim 1 wherein the resist pattern is delineated with a direct write exposure tool.

4. The method of claim 2 wherein the patterning process uses a projection aligner exposure tool.

5. The method of claim 2 wherein the mask contains assist features.

6. The method of claim 2 wherein the patterning process includes an exposure with one or more wavelengths in a range form about 13 nm to about 500 nm.

7. The method of claim 2 wherein the patterning process includes an exposure involving on-axis illumination.

8. The method of claim 2 wherein the patterning process includes an exposure involving off-axis illumination.

9. The method of claim 8 wherein said off-axis illumination is annular illumination.

10. The method of claim 8 wherein said off-axis illumination is quadrupole illumination.

11. The method of claim 8 wherein said off-axis illumination is dipole illumination.

12. The method of claim 2 wherein a third mask and a third exposure are used to remove one or more unwanted islands form the pattern, said third mask having transparent hole regions corresponding to locations of unwanted islands.

13. The method of claim 1 further comprised of using the CMR layer as an etch mask to transfer the pattern into said substrate.

14. A method of forming high resolution contact holes with low edge roughness in a dielectric layer comprising:
    (a) providing a substrate upon which a dielectric layer has been deposited;
    (b) patterning a resist layer to form a resist islands at locations on said dielectric layer;
    (c) coating a complementary replacement material (CMR) layer on said resist island;
    (d) performing a single etch step to etch all of said resist island and a portion of said CMR layer to form an image reversal pattern comprised of contact holes aligned with the locations in said CMR layer, wherein said CMR layer has a lower etch rate than said resist layer such that the resist layer is etched faster than the CMR layer when the CMR layer above a surface of the resist island is etched to expose the surface of the resist island in the single etch step; and
    (e) transferring said image reversal pattern into said dielectric layer with a plasma etch.

15. The method of claim 14 wherein the resist pattern is delineated with a mask selected form a group consisting of binary, phase shifting and phase edge masks.

16. The method of claim 15 wherein the mask contains assist features.

17. The method of claim 15 wherein the patterning process includes an exposure with one or more wavelengths in a range form about 13 nm to about 500 nm.

18. The method of claim 15 wherein the patterning process includes an exposure involving on-axis illumination.

19. The method of claim 15 wherein the patterning process includes an exposure involving off-axis illumination such as dipole, quadrupole, or annular illumination.

20. The method of claim 15 wherein the resist pattern of formed by first exposing through a phase edge mask and then exposing through a second phase edge mask having phase edges orthogonal to the first said mask.

21. The method of claim 20 further comprised of a third mask and a third exposure are used to remove one or more unwanted islands form the pattern, said third mask having transparent hole regions corresponding to locations of unwanted islands.

22. The method of claim 15 wherein the resist pattern is formed by first exposing through a mask containing opaque lines and then exposing through a second mask having opaque lines that are orthogonal to the lines in the first said mask.

23. The method of claim 22 wherein the masks are further comprised of assist lines.

24. The method of claim 14 wherein the CMR layer is comprised of a material such as an organic polymer or fluorosilicate glass that is deposited by a spin coating or by a CVD method which does not mix with or distort the resist pattern.

25. The method of claim 14 wherein the resist layer is preferably a positive tone composition.

26. A method of forming high resolution polysilicon gates with low edge roughness comprising:
   (a) providing a substrate upon which a polysilicon layer has been deposited;
   (b) patterning a resist layer to form a resist pattern with trenches at locations on said polysilicon layer;
   (c) coating a complementary replacement material (CMR) layer on said resist pattern;
   (d) performing a single etch step to etch all of said resist pattern and a portion of said CMR layer to form a reversed image line pattern comprised of CMR layer, wherein said CMR layer has a lower etch rate than said resist layer such that the resist layer is etched faster than the CMR layer when the CMR layer above a surface of the resist pattern is etched to expose the surface of the resist pattern in the single etch step; and
   (e) transferring said reversed image line pattern into said polysilicon layer with a plasma etch.

27. The method of claim 26 wherein the resist pattern is delineated with a mask selected form a group consisting of binary, phase shifting and phase edge masks.

28. The method of claim 27 wherein the mask contains assist features.

29. The method of claim 27 wherein the patterning process includes an exposure with one or more wavelengths in a range form about 13 nm to about 500 nm.

30. The method of claim 27 wherein the patterning process includes an exposure involving on-axis illumination.

31. The method of claim 27 wherein the patterning process includes an exposure involving off-axis illumination such as dipole, quadrupole, or annular illumination.

32. The method of claim 26 wherein the resist pattern is delineated with a direct write exposure tool.

33. The method of claim 26 further comprising an anti-reflective coating between the polysilicon and resist layers.

34. The method of claim 26 wherein the resist patterning step preferably involves a negative mask and a positive tone resist.

35. The method of claim 26 wherein the CMR layer is comprised of a material such as an organic polymer or fluorosilicate glass that is deposited by a spin coating or by a CVD method which does not mix with or distort the resist pattern.

36. A method of forming high resolution trenches with low edge roughness in a via first damascene process comprising:
   (a) providing a substrate upon which a damascene stack has been deposited, said stack comprised of a top etch stop or passivation layer, a middle dielectric layer, and a bottom etch stop layer, said stack also contains a via hole pattern in said dielectric layer;
   (b) patterning a resist layer to form a resist pattern with resist lines at locations on said damascene stack;
   (c) coating a complementary replacement material (CMR) layer on said resist pattern;
   (d) performing a single etch step to etch all of said resist pattern and a portion of said CMR layer to form an image reversal pattern comprised of trenches in said CMR layer, wherein said CMR layer has a lower etch rate than said resist layer such that the resist layer is etched faster than the CMR layer when of the CMR layer above a surface of the resist pattern is etched to expose the surface of the resist pattern in the single etch step; and
   (e) transferring said image reversal pattern into said dielectric layer with a plasma etch.

37. The method of claim 36 wherein the resist pattern is delineated with one or more binary, phase shifting, or phase edge masks.

38. The method of claim 37 wherein the mask contains assist features.

39. The method of claim 37 wherein the patterning process includes an exposure with one or more wavelengths in a range form about 13 nm to about 500 nm.

40. The method of claim 37 wherein the patterning process includes an exposure involving on-axis illumination.

41. The method of claim 37 wherein the patterning process includes an exposure involving off-axis illumination such as dipole, quadrupole, or annular illumination.

42. The method of claim 36 further comprised of completing the dual damascene structure by removing said resist and CMR layers, depositing a barrier metal layer, and depositing a metal layer that is planarized to a level that is coplanar with the top of said damascene stack.

43. The method of claim 36 wherein the CMR layer is comprised of a material such as an organic polymer or fluorosilicate glass that is deposited by a spin coating or by a CVD method which does not mix with or distort the resist pattern.

* * * * *